United States Patent
Frye et al.

(10) Patent No.: US 8,358,179 B2
(45) Date of Patent: Jan. 22, 2013

(54) SEMICONDUCTOR DEVICE AND METHOD OF FORMING DIRECTIONAL RF COUPLER WITH IPD FOR ADDITIONAL RF SIGNAL PROCESSING

(75) Inventors: Robert C. Frye, Piscataway, NJ (US); Kai Liu, Phoenix, AZ (US)

(73) Assignee: STATS ChipPAC, Ltd., Singapore (SG)

( * ) Notice: Subject to any disclaimer, the term of this patent is extended or adjusted under 35 U.S.C. 154(b) by 263 days.

(21) Appl. No.: 12/557,382

(22) Filed: Sep. 10, 2009

(65) Prior Publication Data

US 2011/0057742 A1     Mar. 10, 2011

(51) Int. Cl.
*H01P 5/10* (2006.01)
*H03H 7/42* (2006.01)
(52) U.S. Cl. ............................................. 333/26; 333/4
(58) Field of Classification Search ................ 333/25, 333/26, 4, 246, 238
See application file for complete search history.

(56) References Cited

U.S. PATENT DOCUMENTS

| | | | |
|---|---|---|---|
| 4,999,594 A * | 3/1991 | Ingman | 333/181 |
| 6,150,898 A * | 11/2000 | Kushitani et al. | 333/110 |
| 7,187,910 B2 | 3/2007 | Kim et al. | |
| 7,305,223 B2 | 12/2007 | Liu et al. | |
| 7,847,653 B2 * | 12/2010 | Meharry | 333/25 |

* cited by examiner

*Primary Examiner* — Dean O Takaoka
(74) *Attorney, Agent, or Firm* — Robert D. Atkins; Patent Law Group: Atkins & Associates, P.C.

(57) ABSTRACT

A semiconductor device has a substrate and RF coupler formed over the substrate. The RF coupler has a first conductive trace with a first end coupled to a first terminal of the semiconductor device, and a second conductive trace with a first end coupled to a second terminal of the semiconductor device. The first conductive trace is placed in proximity to a first portion of the second conductive trace. An integrated passive device is formed over the substrate. A second portion of the second conductive trace operates as a circuit component of the integrated passive device. The integrated passive device can be a balun or low-pass filter. The RF coupler also has a first capacitor coupled to the first terminal of the semiconductor device, and second capacitor coupled to a third terminal of the semiconductor device for higher directivity. The second conductive trace is wound to exhibit an inductive property.

20 Claims, 8 Drawing Sheets

SEMICONDUCTOR DEVICE AND METHOD OF FORMING DIRECTIONAL RF COUPLER WITH IPD FOR ADDITIONAL RF SIGNAL PROCESSING

FIELD OF THE INVENTION

The present invention relates in general to semiconductor devices and, more particularly, to a semiconductor device and method of forming a directional coupler circuit with an IPD for additional RF signal processing.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

Baluns (balanced and unbalanced), low-pass filters, and RF couplers are important components in wireless communication systems. The balun suppresses electrical noise, change impedance, and minimize common-mode noise through electromagnetic coupling. The low-pass filter rejects harmonic content from the output signal. The RF coupler detects transmitted power levels from a power amplifier (PA) or transceiver.

Directional RF couplers based on quarter-wavelength sections of coupled striplines use edge coupling between adjacent transmission lines, and are especially well-suited for lower power (10 to 30 dB) applications to sense and control forward transmitted power. A typical low-power RF coupler circuit may contain a trace (inductor), capacitor, and resistor for a combination of inductive coupling and capacitive coupling to achieve directivity. However, these components offer relatively low directivity and coupling strength. For stronger coupling, especially for 3 dB hybrids, the RF coupler may contain multi-layer broadside-coupled lines placed in the output stage of the power amplifier. External environmental factors can result in significant changes in antenna impedance, resulting in mismatches and reflected power which reduces directivity.

SUMMARY OF THE INVENTION

A need exists for a high directivity RF couplers and IPDs for additional RF signal processing. Accordingly, in one embodiment, the present invention is a semiconductor die comprising a substrate and RF coupler formed over the substrate. The RF coupler includes a first conductive trace having a first end coupled to a first terminal of the semiconductor device, and second end coupled to a circuit node, and a second conductive trace having a first end coupled to a second terminal of the semiconductor device, and second end coupled to a third terminal of the semiconductor device. The first conductive trace is placed in proximity to a first portion of the second conductive trace. A low-pass filter is formed over the substrate. A second portion of the second conductive trace operates as a circuit component of the low-pass filter.

In another embodiment, the present invention is a semiconductor die comprising a substrate and RF coupler formed over the substrate. The RF coupler includes a first conductive trace having a first end coupled to a first terminal of the semiconductor device, and second end coupled to a circuit node, and a second conductive trace having a first end coupled to a second terminal of the semiconductor device, and second end coupled to a third terminal of the semiconductor device. The first conductive trace is placed in proximity to a first portion of the second conductive trace. A balun is formed over the substrate. A second portion of the second conductive trace operates as a circuit component of the balun.

In another embodiment, the present invention is a semiconductor die comprising a substrate and RF coupler formed over the substrate. The RF coupler includes a first conductive trace having a first end coupled to a first terminal of the semiconductor device, and a second conductive trace having a first end coupled to a second terminal of the semiconductor device. The first conductive trace is placed in proximity to a first portion of the second conductive trace. An integrated passive device is formed over the substrate. A second portion of the second conductive trace operates as a circuit component of the integrated passive device.

In another embodiment, the present invention is a method of forming a semiconductor die comprising the steps of providing a substrate, and forming an RF coupler over the substrate by forming a first conductive trace having a first end coupled to a first terminal of the semiconductor device, and forming a second conductive trace having a first end coupled to a second terminal of the semiconductor device. The first conductive trace is placed in proximity to a first portion of the second conductive trace. An integrated passive device is formed over the substrate. A second portion of the second conductive trace operates as a circuit component of the integrated passive device.

DETAILED DESCRIPTION OF THE DRAWINGS

Figure 1:
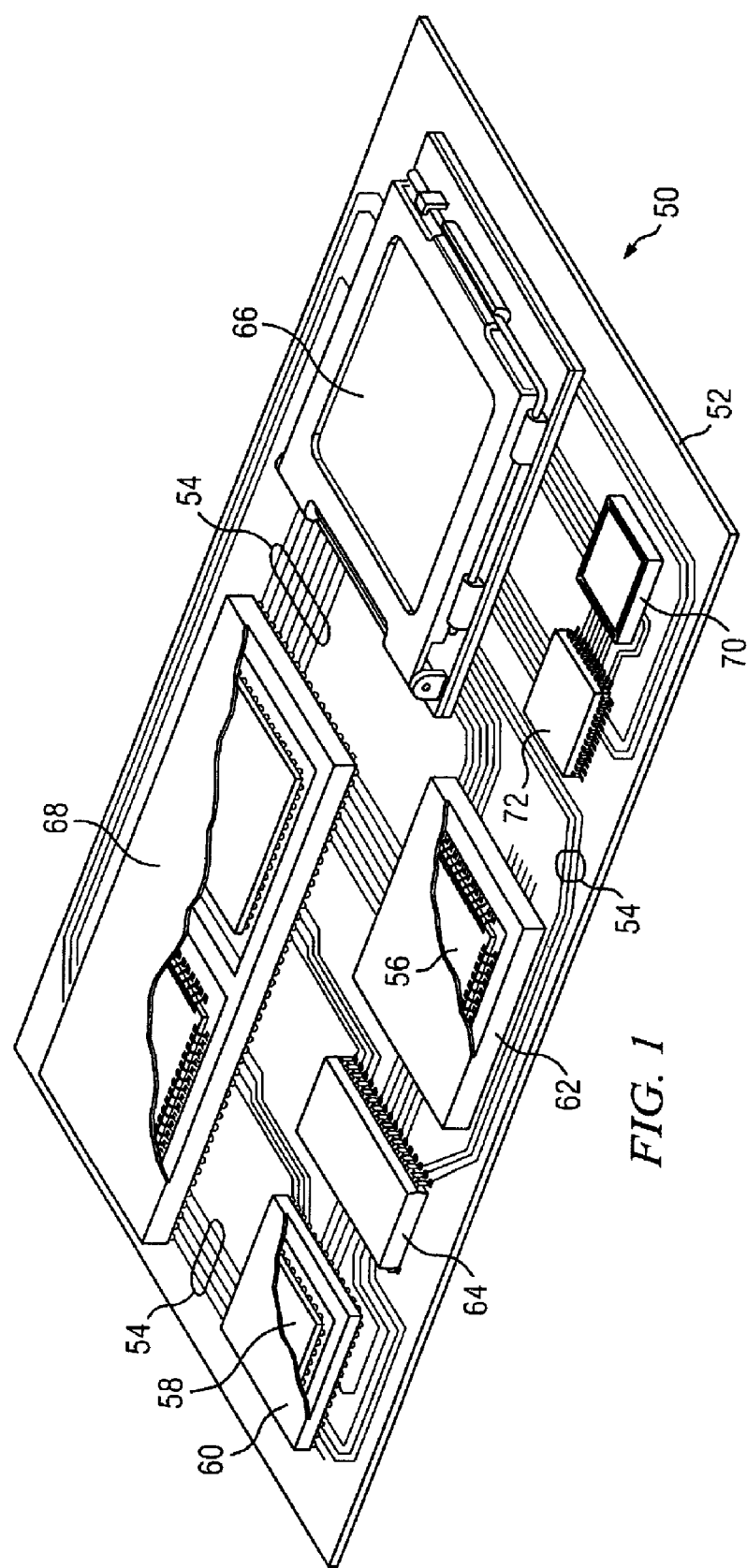
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
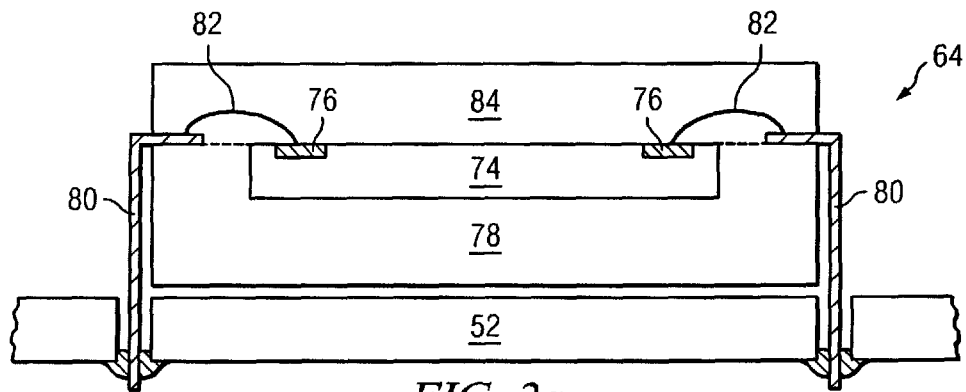
FIGS. 2a-2c illustrate further detail of the representative semiconductor packages mounted to the PCB.
Figure 2B:
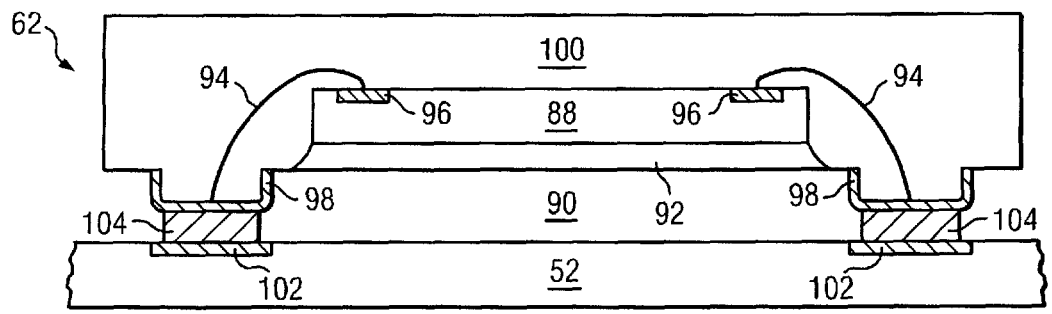
Figure 2C:
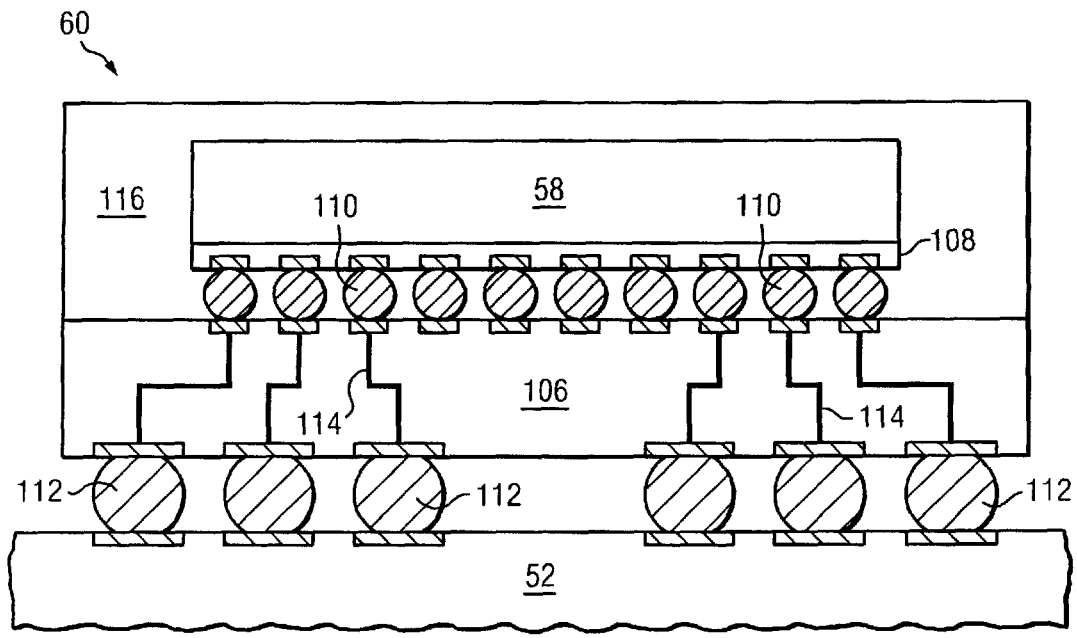

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3:
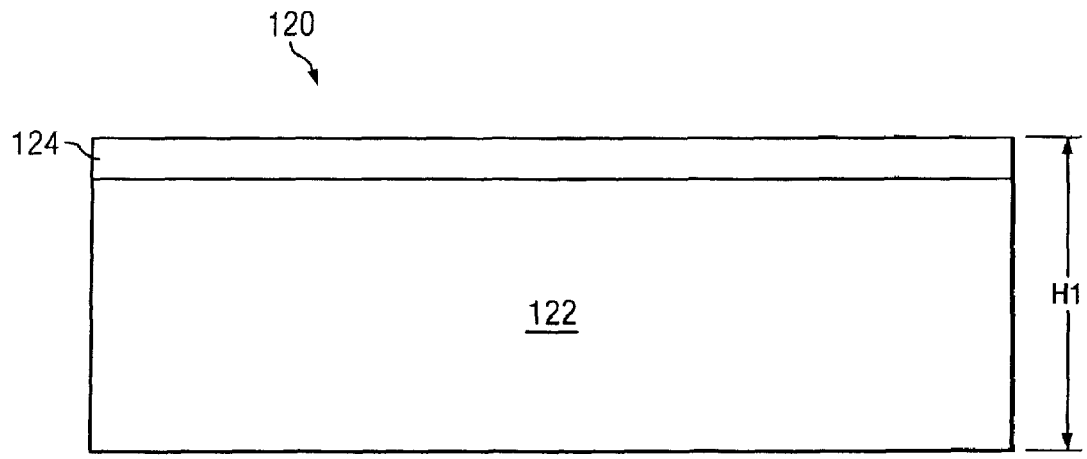
FIG. 3 illustrates a semiconductor package containing an integrated passive device.

Referring to FIG. 3, semiconductor die or package 120 is shown, in relation to FIGS. 1 and 2a-2c, as having a semiconductor substrate 122 made with a base material such as silicon (Si), germanium, gallium arsenide (GaAs), glass, low temperature co-fired ceramic (LTCC), PCB, or other bulk semiconductor material for structural support. An active region 124 is formed over the top surface of semiconductor substrate 122. Active region 124 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface of the die to implement analog circuits or digital circuits. Semiconductor die 122 also contain one or more IPDs, such as thin film inductors, capacitors, and resistors, for RF signal processing. Active region 124 occupies about 5-10% of the overall thickness or height H1 of semiconductor die 120. In one embodiment, semiconductor die 120 occupies an area 3.2 millimeters (mm) by 2.2 mm. Semiconductor die 120 can be electrically connected to other devices using flipchip, bond wires, or interconnect pins.

Semiconductor devices containing a plurality of IPDs can be used in high frequency applications, such as microwave radar, telecommunications, wireless transceivers, electronic switches, and other devices performing RF electrical functions. The IPDs provide the electrical characteristics for circuit functions such as baluns, resonators, high-pass filters, low-pass filters, band-pass filters (BPF), symmetric Hi-Q resonant transformers, matching networks, RF couplers, and tuning capacitors. For example, the IPDs can be used as front-end wireless RF components, which can be positioned between the antenna and transceiver. The wireless application can be a cellular phone using multiple band operation, such as wideband code division multiple access (WCDMA) bands (PCS, IMT, low) and global system mobile communication (GSM) bands (low and high).

In a wireless communication system, the balun suppresses electrical noise, changes impedance, and minimizes common-mode noise through electromagnetic coupling. In some applications, multiple baluns are formed over a common substrate, allowing multi-band operation. For example, two or more baluns are used in a quad-band for mobile phones or other GSM communications, each balun dedicated for a frequency band of operation of the quad-band device. A low-pass filter can be used to reject harmonic content in the output signal. The RF coupler detects transmitted power levels from a power amplifier (PA) or transceiver. A typical RF system requires multiple IPDs and other high frequency circuits in one or more semiconductor packages to perform the necessary electrical functions.

Figure 4:
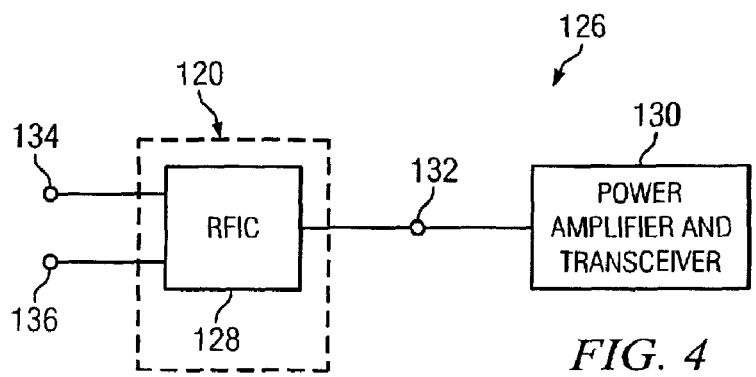
FIG. 4 illustrates a wireless communication system with integrated RF coupler and low-pass filter connected to power amplifier and transceiver.

FIG. 4 illustrates a wireless communication system 126 using an RF integrated circuit (RFIC) 128. RFIC 128 contains a directional RF coupler and common low-pass filter as IPDs integrated on substrate 122 of a single semiconductor die 120. RFIC 128 is coupled to PA and transceiver 130. PA and transceiver 130 amplifies the RF signal for transmission and receive RF signals in full-duplex, and filter and condition the signals for further processing. RFIC 128 is a 3-port device. Terminal 132 is connected to PA and transceiver 130; terminal 134 is a single-ended power output; terminal 136 is a coupling output for detecting transmitter power.

Figure 5:
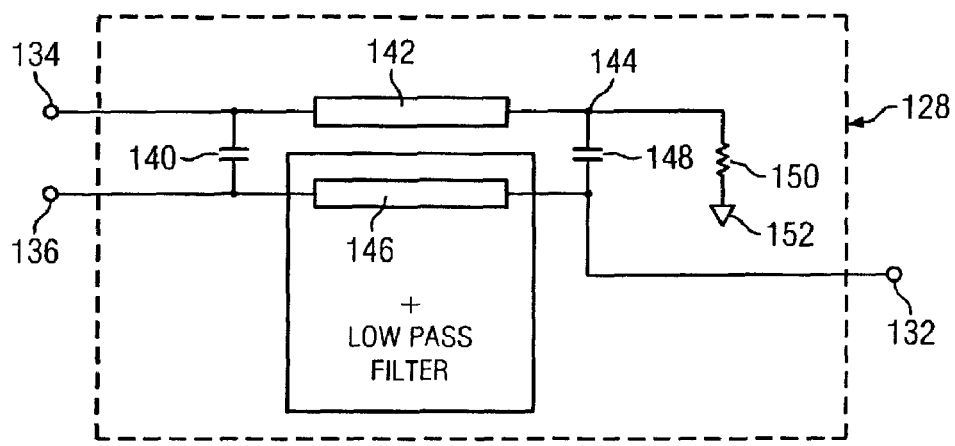
FIG. 5 illustrates further detail of the integrated RF coupler and low-pass filter.

Further detail of RFIC 128 is shown in FIG. 5 with capacitor 140 coupled between terminal 134 and terminal 136. Signal trace or inductor 142 is coupled between terminal 134 and circuit node 144. Coupler trace or inductor 146 is coupled between terminal 132 and terminal 136. The RF coupler circuit detects transmitted power through inductive coupling and capacitive coupling between signal trace 142 and coupler trace 146. Capacitor 148 is coupled between terminal 132 and circuit node 144. A thin film resistor 150 is coupled between circuit node 144 and ground terminal 152. RFIC 128 further contains low-pass filter common with coupler trace 146. The low-pass filter provides additional RF signal processing without consuming significant area or degrading directivity.

Figure 6:
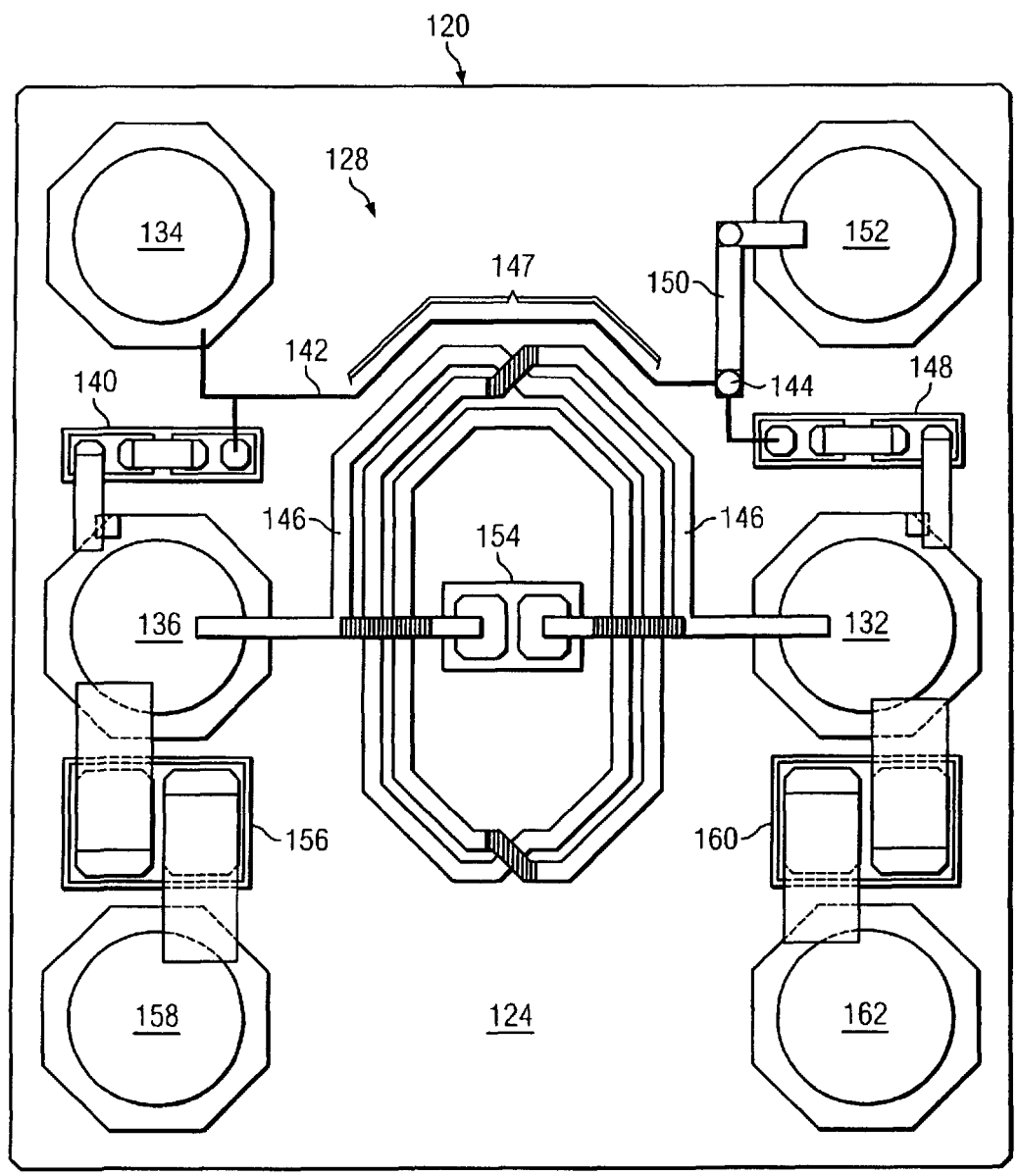
FIG. 6 illustrates a physical circuit layout of the integrated RF coupler and low-pass filter.

FIG. 6 shows a physical circuit layout of RFIC 128 integrated in a small form factor on common substrate 122 of semiconductor die 120. Terminal 134 is coupled to a first end of signal trace 142. A second end of signal trace 142 is coupled to circuit node 144. Terminal 136 is coupled to a first end of coupler trace 146. A second end of coupler trace 146 is coupled to terminal 132. Signal trace 142 is placed in close physical proximity along a portion of coupler trace 146, e.g., in area 147 where signal trace 142 and coupler trace 146 are separated by about 10 micrometers (μm). The magnetic coupling and capacitive coupling between signal trace 142 and coupler trace 146 in area 147 provides a flexible coupling strength. Signal trace 142 and coupler trace 146 can have a rectangular, polygonal, or circular form or shape, about 8 μm in width. Signal trace 142 and coupler trace 146 can be one or more layers of Al, Cu, Sn, Ni, Au, Ag, or other suitable electrically conductive material. Signal trace 142 and coupler trace 146 are formed using evaporation, sputtering, PVD, CVD, electrolytic plating, electroless plating process, or other suitable metal deposition process.

Capacitor 140 is coupled between terminal 134 and terminal 136. Capacitor 148 is coupled between circuit node 144 and terminal 132. Resistor strip 150 is coupled between circuit node 144 and ground terminal 152. Capacitors 140 and 148 can be implemented as two smaller-value capacitors connected in series as shown for better tolerance during the manufacturing process. Capacitors 140 and 148 are implemented using a thin-film dielectric. The thin-film material increases capacitance density. The voltage across capacitor 140 is different from the voltage across capacitor 148. By appropriate selection of capacitance values for capacitors 140 and 148, the phase of the combined electrical coupling is similar to the phase of the magnetic coupling. As a result, capacitors 140 and 148 increase directivity for the RF coupling circuit 142-146 to a value greater than 20 dB. Capacitors 140 and 148 provide greater degrees of freedom in the design of the RF coupler.

Capacitors 140 and 148 also provide electrostatic discharge (ESD) protection for RFIC 128. The ESD robustness in thin-film materials can be obtained by using inductive shunt protection across vulnerable capacitors. Most of the energy in an ESD event is concentrated at low frequency, for which inductors in the nano-Henry range are effectively short circuits. In the magnetically-coupled circuit, each capacitor is protected by a low-value shunt inductor to increase robustness to ESD.

RFIC 128 provides an additional IPD function, in this case a common low-pass filter, in a compact footprint with the RF coupler circuit. The low-pass filter circuit function is implemented with a portion of coupler trace 146. That is, the portion of coupler trace 146 outside area 147 operates as a circuit component of the low-pass filter. Thus, coupler trace 146 serves a common role as RF signal coupler (portion of coupler trace 146 in area 147) and low-pass filter component (portion of coupler trace 146 outside area 147). The low-pass filter also has capacitor 154 coupled between the first end of coupler trace 146 and the second end of coupler trace 146, capacitor 156 coupled between terminal 136 and ground terminal 158, and capacitor 160 coupled between terminal 132 and ground terminal 162.

Figure 7:
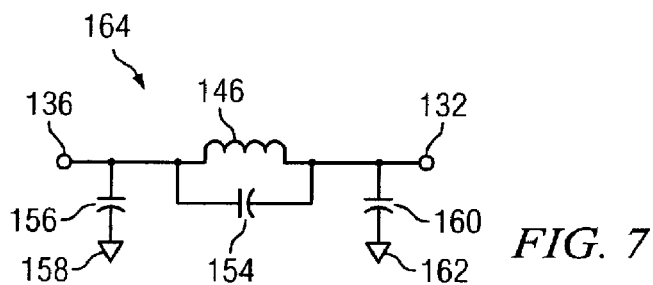
FIG. 7 illustrates a schematic circuit diagram of the low-pass filter.

FIG. 7 is a schematic representation of low-pass filter 164, with coupler trace 146 and capacitors 154, 156, and 160, for additional RF signal processing, such as rejection of harmonic content in the output signal.

Figure 8:
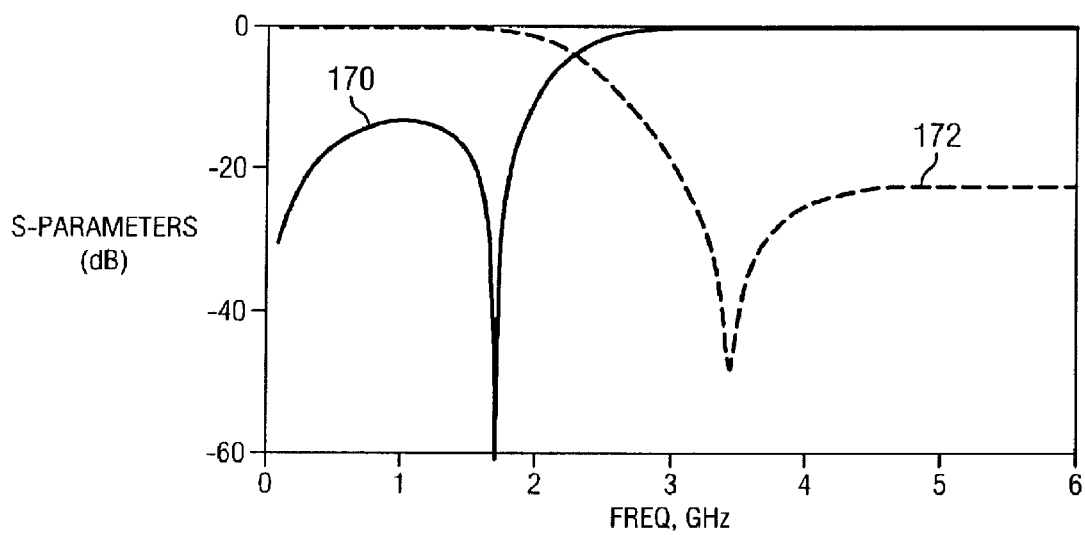
FIG. 8 is a graph of insertion loss and rejection loss versus frequency for the integrated RF coupler and low-pass filter.

FIG. 8 is a waveform plot of the low-pass filter electrical response for a DCS band IPD (1710 MHz-1980 MHz). Plot 170 is insertion loss between terminal 132 and terminal 136; plot 172 is return loss of terminal 136.

Figure 9:
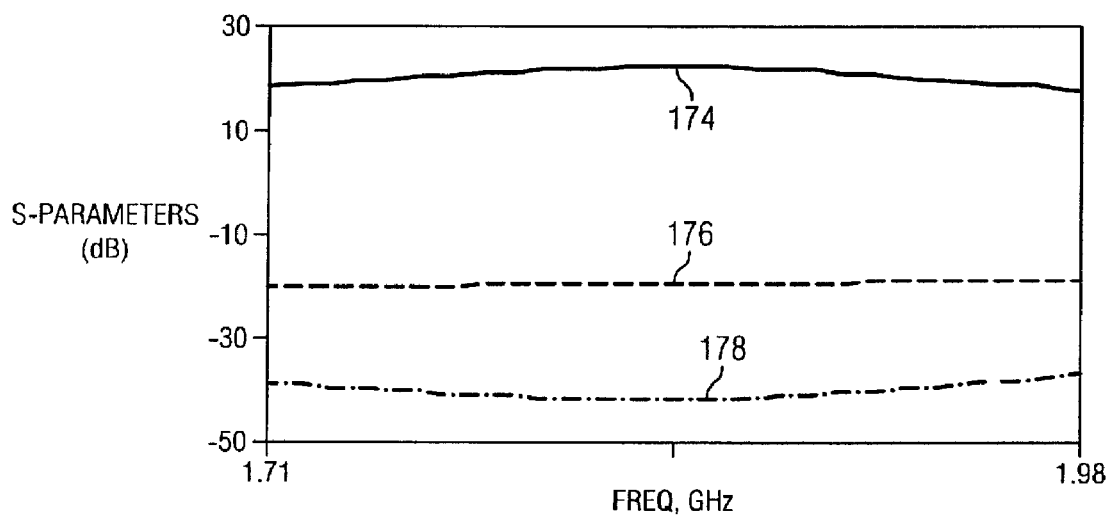
FIG. 9 is a graph of directivity, forward coupling, and backward coupling versus frequency for the integrated RF coupler and low-pass filter.

FIG. 9 is a waveform plot of the RF coupler electrical response for the DCS band IPD. Plot 174 is directivity as the power between terminal 134 and terminal 136 less the power between terminal 134 and terminal 132; plot 176 is forward coupling between terminal 136 and terminal 134; plot 178 is backward coupling between terminal 132 and terminal 134.

Figure 10:
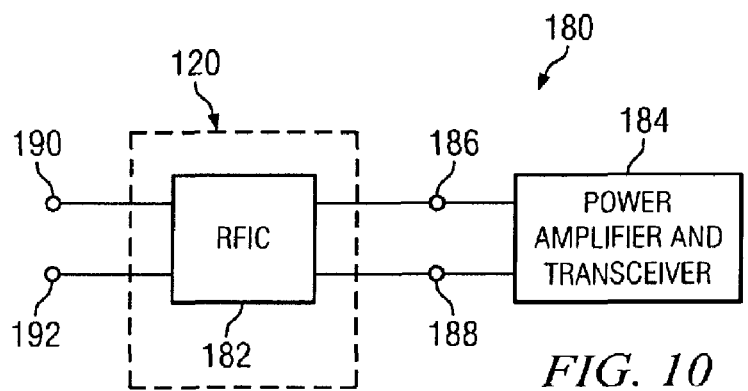
FIG. 10 illustrates a wireless communication system with integrated RF coupler and balun connected to power amplifier and transceiver.

FIG. 10 illustrates a wireless communication system 180 using RFIC 182. RFIC 182 contains a directional RF coupler and common balun as IPDs integrated on substrate 122 of a single semiconductor die 120. RFIC 182 is coupled to PA and transceiver 184. PA and transceiver 184 amplifies the RF signal for transmission and receive RF signals in full-duplex, and filter and condition the signals for further processing. The RF coupler detects the level of transmitted power from PA and transceiver 184. RFIC 182 is a 4-port device. Terminals 186 and 188 are differential ports connected to PA and transceiver 184; terminal 190 is a single-ended power output; terminal 192 is a coupling output for detecting transmitter power.

Figure 11:
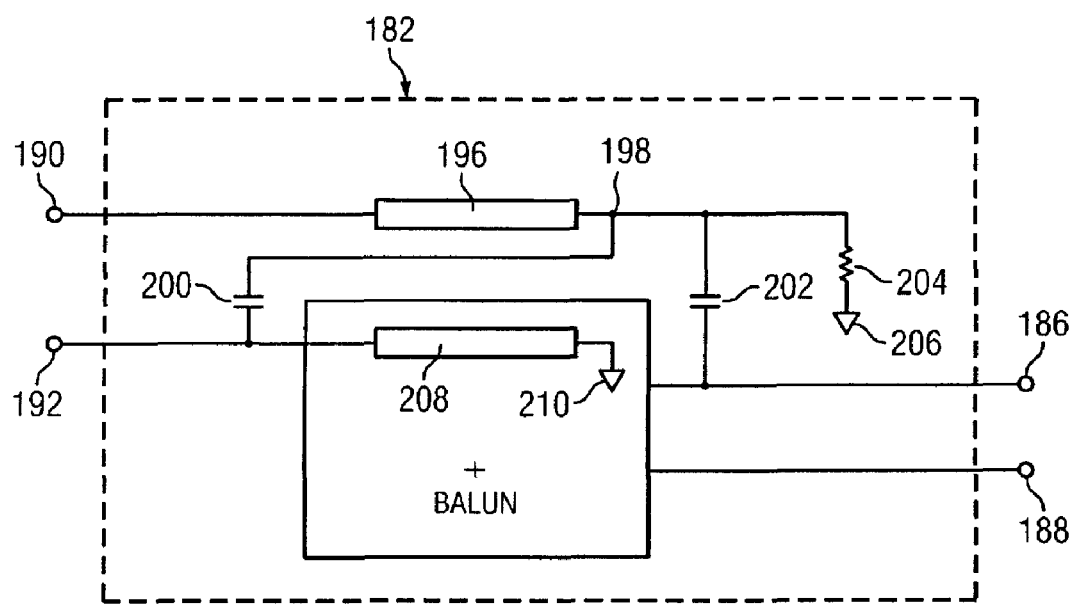
FIG. 11 illustrates further detail of the integrated RF coupler and balun.

Further detail of RFIC 182 is shown in FIG. 11 with signal trace or inductor 196 coupled between terminal 190 and circuit node 198. Capacitor 200 is coupled between terminal 192 and circuit node 198. Capacitor 202 is coupled between terminal 186 and circuit node 198. A thin film resistor 204 is coupled between circuit node 198 and ground terminal 206. Coupler trace or inductor 208 is coupled between terminal 192 and ground terminal 210. The RF coupler circuit detects transmitted power through inductive coupling and capacitive coupling between signal trace 196 and coupler trace 208. RFIC 182 further contains a balun common with coupler trace 208. The balun provides additional RF signal processing without consuming significant area or degrading directivity.

Figure 12:
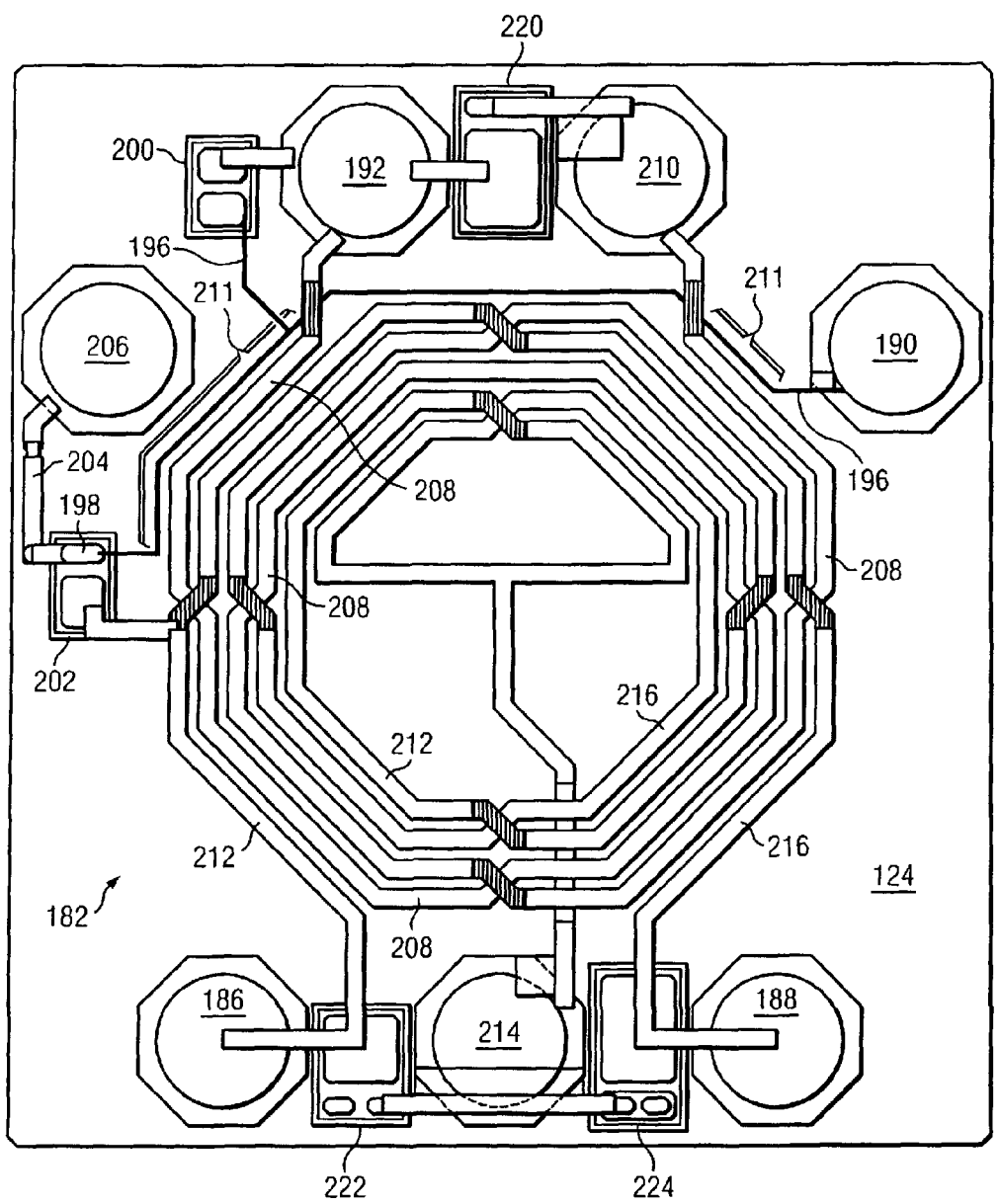
FIG. 12 illustrates a physical circuit layout of the integrated RF coupler and balun.

FIG. 12 shows a physical circuit layout of RFIC 182 integrated in a small form factor on common substrate 122 of semiconductor die 120. Terminal 190 is coupled to a first end of signal trace 196. A second end of signal trace 196 is coupled to circuit node 198. Terminal 192 is coupled to a first end of coupler trace 208. A second end of coupler trace 208 is coupled to ground terminal 210. Signal trace 196 is placed in close physical proximity along a portion of coupler trace 208, e.g., in areas 211 where signal trace 196 and coupler trace 208 are separated by about 10 μm. The magnetic coupling and capacitive coupling between signal trace 196 and coupler trace 208 in areas 211 provides a flexible coupling strength. Signal trace 196 and coupler trace 208 can have a rectangular, polygonal, or circular form or shape, about 8 μm in width. Signal trace 196 and coupler trace 208 can be one or more layers of Al, Cu, Sn, Ni, Au, Ag, or other suitable electrically conductive material. Signal trace 196 and coupler trace 208 are formed using evaporation, sputtering, PVD, CVD, electrolytic plating, electroless plating process, or other suitable metal deposition process.

Capacitor 200 is coupled between terminal 192 and signal trace 196. Capacitor 202 is coupled between the second end of signal trace 196 (circuit node 198) and trace 212, which is connected to terminal 186. Resistor strip 204 is coupled between the second end of signal trace 196 (circuit node 198) and ground terminal 206. Capacitors 200 and 202 can be implemented as two smaller-value capacitors connected in series as shown for better tolerance during the manufacturing process. Capacitors 200 and 202 are implemented using a thin-film dielectric. The thin-film material increases capacitance density. The voltage across capacitor 200 is different from the voltage across capacitor 202. By appropriate selection of capacitance values for capacitors 200 and 202, the phase of the combined electrical coupling is similar to the phase of the magnetic coupling. As a result, capacitors 200 and 202 increase directivity for the RF coupling circuit 196, 208 to a value greater than 20 dB. Capacitors 200 and 202 provide greater degrees of freedom in the design of the RF coupler.

Capacitors 200 and 202 also provide ESD protection for RFIC 182. The ESD robustness in thin-film materials can be obtained by using inductive shunt protection across vulnerable capacitors. Most of the energy in an ESD event is concentrated at low frequency, for which inductors in the nano-Henry range are effectively short circuits. In the magnetically-coupled circuit, each capacitor is protected by a low-value shunt inductor to increase robustness to ESD.

RFIC 182 provides an additional IPD function, in this case a common balun, in a compact footprint with the RF coupler circuit. The balun function is implemented with a portion of coupler trace 208. That is, the portion of coupler trace 208 outside areas 211 operates as a circuit component of the balun. Thus, coupler trace 208 serves a common role as RF signal coupler (portion of coupler trace 208 in areas 211) and balun component (portion of coupler trace 208 outside areas 211). The balun also has trace 212 having a first end coupled to terminal 186 and second end coupled to ground terminal 214, and trace 216 having a first end coupled to terminal 188 and a second end coupled to ground terminal 214. Traces 208, 212, and 216 are wound and interwoven to exhibit mutual inductive properties. The balun also has capacitor 220 coupled between terminal 192 and ground terminal 210, capacitor 222 coupled between terminal 186 and ground terminal 214, and capacitor 224 coupled between terminal 188 and ground terminal 214.

Figure 13:
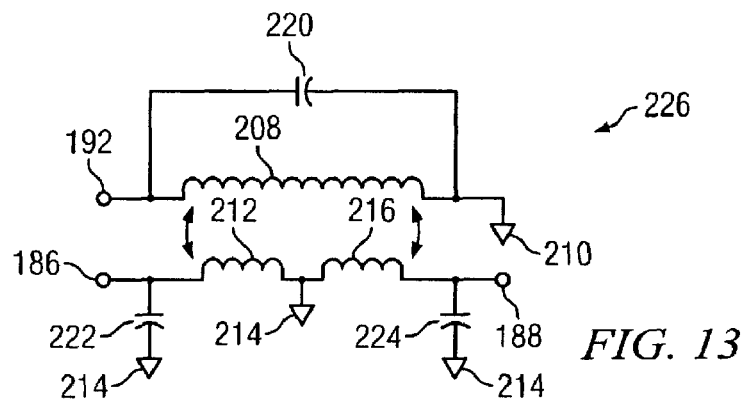
FIG. 13 illustrates a schematic circuit diagram of the balun.

FIG. 13 is a schematic representation of balun 226, with traces 208, 212, and 216 and capacitors 220, 222, and 224, for additional RF signal processing, such as suppressing electrical noise, change impedance, and minimize common-mode noise through electromagnetic coupling. The arrows illustrate mutual inductance between traces 208, 212, and 216.

Figure 14:
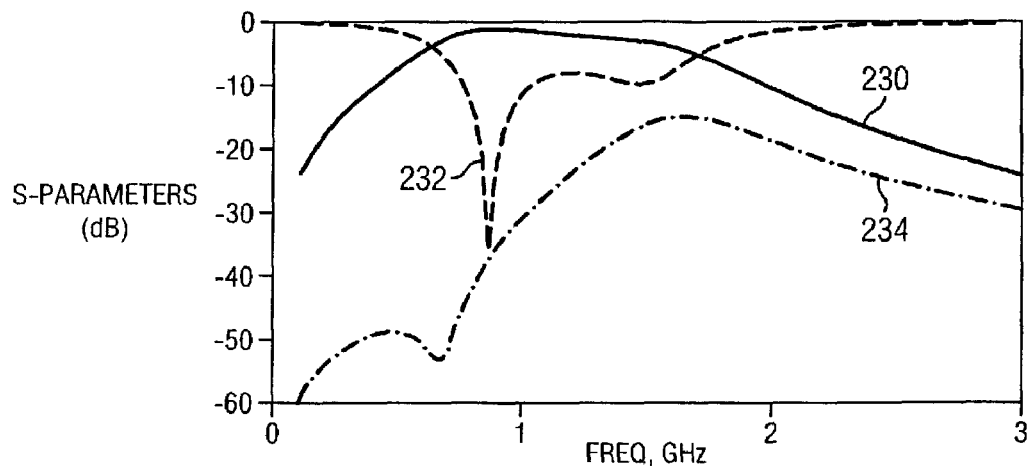
FIG. 14 is a graph of insertion loss, rejection loss, and common mode rejection versus frequency for the integrated RF coupler and balun.

FIG. 14 is a waveform plot of the electrical response of the balun for a GSM band (824 MHz-915 MHz). Plot 230 is insertion loss between terminal 192 and terminal 186; plot 232 is return loss of terminal 192; plot 234 is common mode rejection between terminal 192 and terminal 188.

Figure 15:
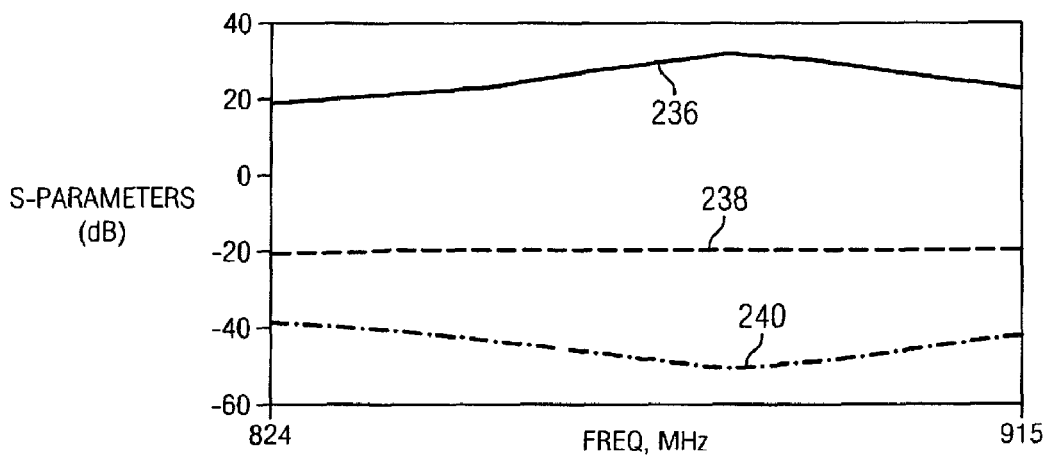
FIG. 15 is a graph of directivity, forward coupling, and backward coupling versus frequency for the integrated RF coupler and balun.

FIG. 15 is a waveform plot of the electrical response of the RF coupler for a GSM band. Plot 236 is directivity as the power between terminal 190 and terminal 186 less the power between terminal 190 and terminal 192; plot 238 is forward coupling between terminal 190 and terminal 186; plot 240 is backward coupling between terminal 190 and terminal 192.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a substrate;
a radio frequency (RF) coupler formed over the substrate, the RF coupler including,
  (a) a first conductive trace having a first end coupled to a first terminal of the semiconductor device, and second end coupled to a circuit node, and
  (b) a second conductive trace having a first end coupled to a second terminal of the semiconductor device, and second end coupled to a third terminal of the semiconductor device, the first conductive trace being placed in proximity to a first portion of the second conductive trace; and
a low-pass filter formed over the substrate, wherein a second portion of the second conductive trace operates as a circuit component of the low-pass filter, the low-pass filter including,
  (c) the second portion of the second conductive trace,
  (d) a first capacitor coupled between the second terminal and a fourth terminal of the semiconductor device,
  (e) a second capacitor coupled between the third terminal and a fifth terminal of the semiconductor device, and
  (f) a third capacitor coupled between the second terminal and third terminal of the semiconductor device.

2. The semiconductor device of claim 1, wherein the RF coupler further includes:
a fourth capacitor coupled between the first terminal and second terminal of the semiconductor device; and
a fifth capacitor coupled between the third terminal and circuit node of the semiconductor device.

3. The semiconductor device of claim 1, further including a resistor coupled between the circuit node and a fourth terminal of the semiconductor device.

4. The semiconductor device of claim 1, wherein the second conductive trace is wound to exhibit an inductive property.

5. A semiconductor device, comprising:
a substrate;
a radio frequency (RF) coupler formed over the substrate, the RF coupler including,
  (a) a first conductive trace having a first end coupled to a first terminal of the semiconductor device, and second end coupled to a circuit node, and
  (b) a second conductive trace having a first end coupled to a second terminal of the semiconductor device, and second end coupled to a third terminal of the semiconductor device, the first conductive trace being placed in proximity to a first portion of the second conductive trace; and
a balun formed over the substrate, wherein a second portion of the second conductive trace operates as a circuit component of the balun, the balun including,
  (c) the second portion of the second conductive trace,
  (d) a third conductive trace coupled between a fourth terminal and a fifth terminal of the semiconductor device,
  (e) a fourth conductive trace coupled between a sixth terminal and the fifth terminal of the semiconductor device,
  (f) a first capacitor coupled between the fourth terminal and fifth terminal of the semiconductor device, and
  (g) a second capacitor coupled between the sixth terminal and the fifth terminal of the semiconductor device.

6. The semiconductor device of claim 5, wherein the RF coupler further includes:
a third capacitor coupled between the second terminal and circuit node; and
a fourth capacitor coupled between a fourth terminal and the circuit node.

7. The semiconductor device of claim 5, wherein the balun further includes a third capacitor coupled between the second terminal and third terminal of the semiconductor device.

8. The semiconductor device of claim 5, wherein the third and fourth conductive traces are wound to exhibit inductive properties.

9. The semiconductor device of claim 5, wherein the second conductive trace is wound to exhibit an inductive property.

10. The semiconductor device of claim 5, further including a resistor coupled between the circuit node and a fourth terminal of the semiconductor device.

11. A semiconductor device, comprising:
a substrate;
a radio frequency (RF) coupler formed over the substrate, the RF coupler including,
  (a) a first conductive trace comprising a first portion of the RF coupler and including a first end coupled to a first terminal of the semiconductor device, and
  (b) a second conductive trace wound in a coil with a first end coupled to a second terminal of the semiconductor device, wherein a first portion of the coil is disposed in proximity to the first conductive trace as a second portion of the RF coupler; and
an integrated passive device formed over the substrate, wherein a second portion of the coil outside the proximity of the first conductive trace operates as a circuit component of the integrated passive device, wherein the integrated passive device includes a low-pass filter, the low-pass filter including,
  (c) the second portion of the second conductive trace;
  (d) a first capacitor coupled between the second terminal and a third terminal of the semiconductor device;
  (e) a second capacitor coupled between a fourth terminal and a fifth terminal of the semiconductor device; and
  (f) a third capacitor coupled between the second terminal and fourth terminal of the semiconductor device.

12. The semiconductor device of claim 11, wherein the integrated passive device further includes a balun.

13. A method of making a semiconductor device, comprising:
providing a substrate;
forming a radio frequency (RF) coupler over the substrate by,
  (a) forming a first conductive trace comprising a first portion of the RF coupler, and
  (b) forming a second conductive trace wound in a coil, wherein a first portion of the coil is disposed in proximity to the first conductive trace as a second portion of the RF coupler; and
forming an integrated passive device over the substrate, wherein a second portion of the coil outside the proximity of the first conductive trace operates as a circuit component of the integrated passive device, wherein forming the integrated passive device includes forming a low-pass filter, the low-pass filter including,
  (c) the second portion of the second conductive trace;
  (d) coupling a first end of the first conductive trace to a first terminal of the semiconductor device;
  (e) coupling a first end of the second conductive trace to a second terminal of the semiconductor device;

(f) forming a first capacitor coupled between the second terminal and a third terminal of the semiconductor device;

(g) forming a second capacitor coupled between a fourth terminal and a fifth terminal of the semiconductor device; and (h) forming a third capacitor coupled between the second terminal and fourth terminal of the semiconductor device.

14. The method of claim 13, wherein forming the integrated passive device includes forming a balun.

15. A semiconductor device, comprising: a substrate; a radio frequency (RF) coupler formed over the substrate, the RF coupler including, (a) a first conductive trace, and (b) a second conductive trace wound in a coil with a first portion of the coil disposed in proximity to the first conductive trace; and an integrated passive device (IPD formed over the substrate, wherein a second portion of the coil operates as a circuit component of the IPD and wherein the IPD includes a capacitor coupled between a first end of the second conductive trace and a second end of the second conductive trace.

16. The semiconductor device of claim 15, wherein the RF coupler further includes a first end of the first conductive trace coupled to a first terminal of the semiconductor device.

17. The semiconductor device of claim 15, wherein the IPD includes a low-pass filter.

18. The semiconductor device of claim 17, wherein the low-pass filter further includes
a first end of the first conductive trace coupled to a first terminal of the semiconductor device.

19. The semiconductor device of claim 15, wherein the IPD includes a balun.

20. The semiconductor device of claim 19, wherein the balun further includes:
a first end of the first conductive trace coupled to a first terminal of the semiconductor device;
the first end of the second conductive trace coupled to a second terminal of the semiconductor device;
a third conductive trace coupled between a third terminal and a fourth terminal of the semiconductor device; and
a fourth conductive trace coupled between a fifth terminal and the fourth terminal of the semiconductor device.

* * * * *